United States Patent
Ji et al.

(10) Patent No.: US 9,666,266 B1
(45) Date of Patent: May 30, 2017

(54) POWER CONTROL OVER MEMORY CELL ARRAYS

(71) Applicant: Xilinx, Inc., San Jose, CA (US)

(72) Inventors: Hongbin Ji, San Jose, CA (US);
Ephrem C. Wu, San Mateo, CA (US);
Thomas H. Strader, Yorba Linda, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/150,115

(22) Filed: May 9, 2016

(51) Int. Cl.
*G11C 11/418* (2006.01)
(52) U.S. Cl.
CPC .................. *G11C 11/418* (2013.01)
(58) Field of Classification Search
CPC ..... G11C 11/418; G11C 5/148; G06F 1/3287; G06F 1/3275
See application file for complete search history.

(56) References Cited

U.S. PATENT DOCUMENTS

| | | | |
|---|---|---|---|
| 5,524,097 | A | 6/1996 | Lee |
| 6,072,348 | A | 6/2000 | New et al. |
| 7,239,173 | B1 | 7/2007 | Voogel |
| 7,389,485 | B1 | 6/2008 | Rahut et al. |
| 7,436,208 | B1 | 10/2008 | Pham |
| 8,058,905 | B1 | 11/2011 | Klein et al. |
| 8,104,012 | B1 | 1/2012 | Klein et al. |
| 9,083,340 | B1 | 7/2015 | Wu et al. |
| 2002/0008999 | A1* | 1/2002 | Hidaka .............. H03K 19/0016 365/200 |
| 2010/0082861 | A1* | 4/2010 | Barbara ................. G06F 13/28 710/106 |

OTHER PUBLICATIONS

Xilinx, "UltraScale Architecture Memory Resources," UG573 (v1.3), Nov. 24, 2015, pp. 1-121, Xilinx, Inc., San Jose, California, USA.

* cited by examiner

*Primary Examiner* — Douglas King
(74) *Attorney, Agent, or Firm* — LeRoy D. Maunu (57) ABSTRACT

In disclosed circuit arrangements, memory cell arrays are addressed by a first portion of an input address, and memory cells within each memory cell array are addressed by a second portion of the input address. A first first-in-first-out (FIFO) buffer is coupled to the memory cell arrays and delays the second portion of each input address to the memory cell arrays for a sleep period. Control circuits respectively coupled to the memory cell arrays include second FIFO buffers and decode the first portion of each input address and generate corresponding states of enable signals. The control circuits store the corresponding states of the enable signals in the second FIFO buffers concurrently with input of the second portion of each input address to the first FIFO buffer. The second FIFO buffers delay output of the corresponding states of the enable signals to the memory cell arrays for the sleep period. Each control circuit further switches a corresponding memory cell array into a sleep mode in response to all states of the enable signal in the corresponding second FIFO buffer being in a non-enabled state.

20 Claims, 7 Drawing Sheets

FIG. 7

POWER CONTROL OVER MEMORY CELL ARRAYS

TECHNICAL FIELD

The disclosure generally relates to controlling power to memory cell arrays.

BACKGROUND

In some field programmable gate arrays (FPGAs) and systems on a chip (SoCs), multiple memory cell arrays are available to instantiate memory resources to be used in a circuit design as implemented on the FPGA or SoC. Multiple memory cell arrays may be cascaded to implement a RAM of a desired size.

FPGAs and SoCs available from XILINX®, Inc., have memory cell arrays that can be put into a sleep mode in order to save power. A sleep pin on each memory cell array provides a dynamic power gating capability for when the memory cell array is not actively used for an extended period of time. A memory cell array may be put into sleep mode during periods of inactivity. When the memory cell array is to be accessed by a circuit, the memory cell is put into standby mode. In sleep mode, the memory cell array maintains the state of data stored therein, but consumes less power than when the memory cell array is in standby mode. An access request is ignored when presented at a port of the memory cell array while memory cell array is in sleep mode. When in standby mode, the memory cell array processes an access request presented at the port of the memory cell array.

The sleep pins on memory cell arrays provide opportunities for circuit designers to reduce the power consumed by implemented designs. However, designers must know at the time the design is created which memory cell arrays are to be used and when the memory cell arrays are to be used in order to benefit from power savings.

SUMMARY

One implementation of a circuit arrangement includes a plurality of memory cell arrays, a first first-in-first-out (FIFO) buffer coupled to the plurality of memory cell arrays, and a plurality of control circuits coupled to the plurality of memory cell arrays, respectively. The plurality of memory cell arrays is addressed by a first portion of an input address, and memory cells within each memory cell array are addressed by a second portion of the input address. The first FIFO buffer is configured and arranged to delay the second portion of each input address to the plurality of memory cell arrays for a sleep period. Each control circuit includes a respective second FIFO buffer and each control circuit is configured and arranged to decode the first portion of each input address and generate a corresponding state of an enable signal. The control circuit stores the corresponding state of the enable signal in the respective second FIFO buffer concurrently with input of the second portion of each input address to the first FIFO buffer. The second FIFO buffer is configured and arranged to delay output of the corresponding state of the enable signal to the respective memory cell array for the sleep period. The control circuit further switches the respective memory cell array into a sleep mode in response to all states of the enable signal in the second FIFO buffer being in a non-enabled state.

In another implementation, a method of controlling power modes on a plurality of memory cell arrays includes inputting a sequence of addresses to a plurality of memory cell arrays. Each address includes a first portion that addresses the memory cell arrays and a second portion that addresses memory cells within each memory cell array. The method further includes storing second portions of the sequence of addresses in a first first-in-first-out (FIFO) buffer and delaying input of the second portion of each input address to the plurality of memory cell arrays for a sleep period by the first FIFO buffer. The first portion of each address is decoded at a plurality of control circuits coupled to the plurality of memory cell arrays, respectively, and corresponding states of enable signals are generated based on the decoded first portion of each address. The method stores the corresponding states of the enable signals in a plurality of second FIFO buffers, respectively, concurrently with input of the second portion of each input address to the first FIFO buffer. Each second FIFO buffer is configured and arranged to delay output of the corresponding state of the enable signal to a respective one of the memory cell arrays for the sleep period. A respective one of the memory cell arrays is switched into a sleep mode in response to all states of the enable signal in the respective second FIFO buffer being in a non-enabled state.

Other features will be recognized from consideration of the Detailed Description and Claims, which follow.

BRIEF DESCRIPTION OF THE DRAWINGS

Various aspects and features of the method and circuit arrangement will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The inventors recognized that when a number of memory cell arrays are combined into a memory matrix to provide a RAM of a desired size, each request to the memory matrix accesses only one of the memory cell arrays for a single port memory matrix or two memory cell arrays for a dual port memory matrix, which provides opportunities for power savings. Thus, in a memory matrix having N single port memory cell arrays, N−1 of the memory cell arrays are not accessed in each request, and in a memory matrix having N dual port memory cell arrays, N−2 of the memory cell arrays are not accessed in each request. Multiple memory cell arrays may be cascaded to implement a RAM of a desired size, as described in U.S. Pat. No. 9,083,340, the entire contents of which are incorporated herein by reference.

Though only one or two of the memory cell arrays is accessed in each request, putting the remaining (N−1) or (N−2) of the memory cell arrays that are not accessed into sleep mode is undesirable, because one of the (N−1) or (N−2) memory cell arrays may be accessed in the next request, and cycling a memory cell array between sleep and standby modes may consume more power than keeping the memory cell array in standby mode. In order to realize power savings in putting a memory cell array into sleep mode, the power savings during a period for which the memory cell array is in sleep mode, which factors in power consumed in cycling from standby to sleep to standby, must be greater than the power consumed during an equal period when the memory cell array is in standby mode.

The disclosed approaches look ahead at memory access requests and determine which memory cell arrays will be accessed and when the memory cell arrays will be accessed in order to select which memory cell arrays to put into sleep mode and to determine when to wake and put memory cell arrays into standby mode. Memory access requests are pipelined in order to provide a view of which memory cell arrays will be accessed and when the memory cell arrays will be accessed. A memory access request is stored in each stage of the pipeline, and the memory access requests are shifted through the pipeline, with one memory access request exiting the pipeline in each access cycle of the memory matrix. The access cycle of the memory matrix is the period of time that begins when the memory matrix inputs an access request and ends when processing of the access request is complete and the memory matrix inputs the next access request.

The depth of the memory cell array may be based on the minimum number of access cycles ("Nh cycles") to keep a memory cell array in sleep mode in order to save power. If a memory cell array will not be accessed within Nh cycles, the memory cell array may be put into sleep mode. If a memory cell array will be accessed within the next Nh cycles, the memory cell array is not put into sleep mode.

In one or more of the disclosed circuit arrangements, multiple memory cell arrays are connected to form a single address space. The memory cell arrays are addressed by a first portion of an input address, and memory cells within each memory cell array are addressed by a second portion of the input address. A first first-in-first-out (FIFO) buffer is coupled to the plurality of memory cell arrays. The first FIFO buffer provides a pipeline that delays the second portion of each input address to the plurality of memory cell arrays for a sleep period, which is Nh access cycles. In implementations having dual port memory cell arrays, another FIFO buffer provides a pipeline that delays the second portion of the second-port address to the second port of the memory cell arrays for the same sleep period.

For each memory cell array, a respective control circuit controls putting the memory cell array into sleep mode, waking the memory cell array from sleep mode and putting the memory cell array into standby mode. Each control circuit decodes the first portion of each input address and generates a corresponding state of an enable signal indicating whether or not the first portion of the address references the memory cell array. The control circuit stores the state of the enable signal in a second FIFO buffer concurrently with input of the second portion of each input address to the first FIFO buffer. The second FIFO buffer delays output of the corresponding state of the enable signal to the respective memory cell array for the sleep period. The delays of the second portion of the address by the first FIFO buffer and the enable signal state by the second FIFO buffer are the same, so that the enable signal state is provided to the enable pin of the memory cell array at the same time the corresponding second portion of the address is provided at the address pins of the memory cell array.

The control circuit uses the states of the enable signal in the second FIFO buffer to determine whether and when to switch the memory cell array between sleep and standby modes. If all states of the enable signal in the second FIFO buffer are in a non-enabled state, the control circuit switches the memory cell array into a sleep mode. The control circuit switches the memory cell array into a standby mode in response to the state of the enable signal at a position in the second FIFO buffer being in an enabled state. The position in the second FIFO buffer that the control circuit uses to determine whether or not to wake the memory cell array depends on the period of time required by the memory cell array to transition from sleep mode to standby mode. For example, if the memory cell array requires one access cycle to transition from sleep mode to standby mode, the control circuit tests the state of the second-to-last entry in the FIFO buffer. The "last" entry in the FIFO buffer is the entry having the next signal state to be output. The position in the second FIFO buffer used to determine switching to standby mode allows the memory cell array to transition from sleep mode to standby mode in time for the state of the enable signal to exit the second FIFO buffer and be input to the memory cell array.

Though implementations involving single portion memory cell arrays and dual port memory cell arrays are described herein, those skilled in the art will recognize that the disclosed approaches are applicable to memory cell arrays having any number of ports.

Figure 1:
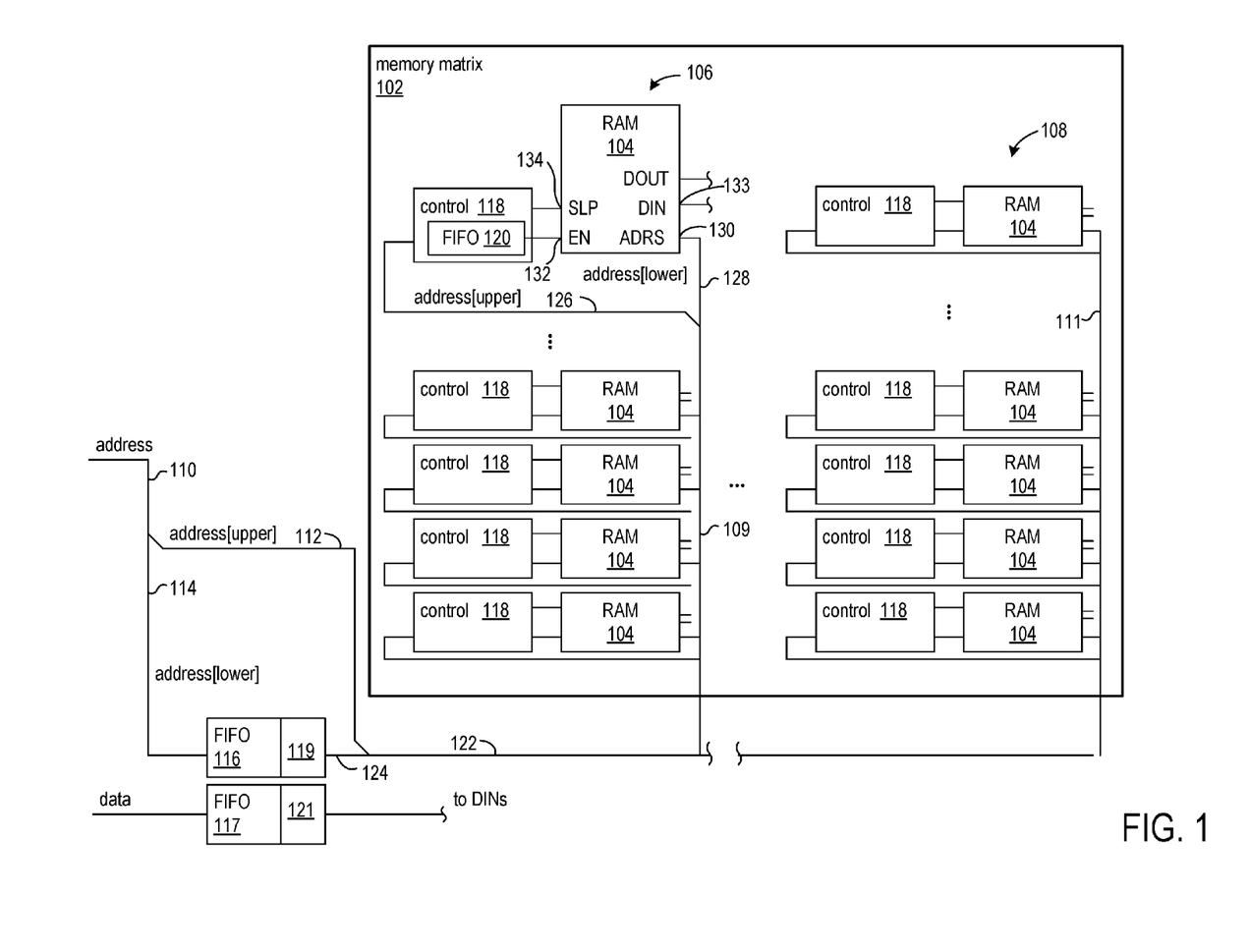
FIG. 1 shows an example of a memory matrix in which individual memory cell arrays may be switched between sleep and standby modes by pipelining memory access requests and putting a memory cell array to sleep if the array will not be accessed for at least a period of time imposed by the pipeline.

FIG. 1 shows an example of a memory matrix 102 in which individual memory cell arrays may be switched between sleep and standby modes by pipelining memory access requests and putting a memory cell array to sleep if the array will not be accessed for at least a period of time imposed by the pipeline. Though single-port RAMs are shown, the system may be adapted for use with dual-port RAMs as shown in the following figures.

The memory matrix 102 includes multiple memory cell arrays. Each RAM 104 is an instance of a memory cell array in the memory matrix. The memory cell arrays may be arranged in one or more columns, such as columns 106 and 108. It should be understood that the terms "vertical", "column", "horizontal", and "row" are relative and depend on the orientation of the diagram or circuit. Each column 106 and 108 contains cascade circuitry, as represented by lines 109 and 111, that includes transistors and wires that stitch the memory cell arrays of the column together to form a deep logical SRAM. As described in U.S. Pat. No. 9,083, 340, the cascade circuitry is configurable to construct blocks of RAM of the desired size.

The memory cell arrays of the memory matrix provide an address space that is addressable by an address on line 110. The input address includes an upper portion 112 ("address [upper]"), which may be the most significant address bits, and a lower portion 114 ("address[lower]"), which may be the least significant address bits. The address lower portion is input to FIFO buffer 116, and the upper address portion bypasses the FIFO buffer 116. For write operations, data is input to FIFO buffer 117, which advances data through the FIFO as corresponding addresses are advanced through the FIFO buffer 116.

FIFO buffers 116 and 117 include respective depth control sub-circuits 119 and 121 that are responsive to the value in a register (e.g., FIG. 3, #308) for specifying the depth of the FIFO buffers. Each depth-control circuit controls depth of the FIFO buffer by selection of output from one of the plurality of stages of the FIFO buffer in response to the FIFO depth value.

Figure 2:
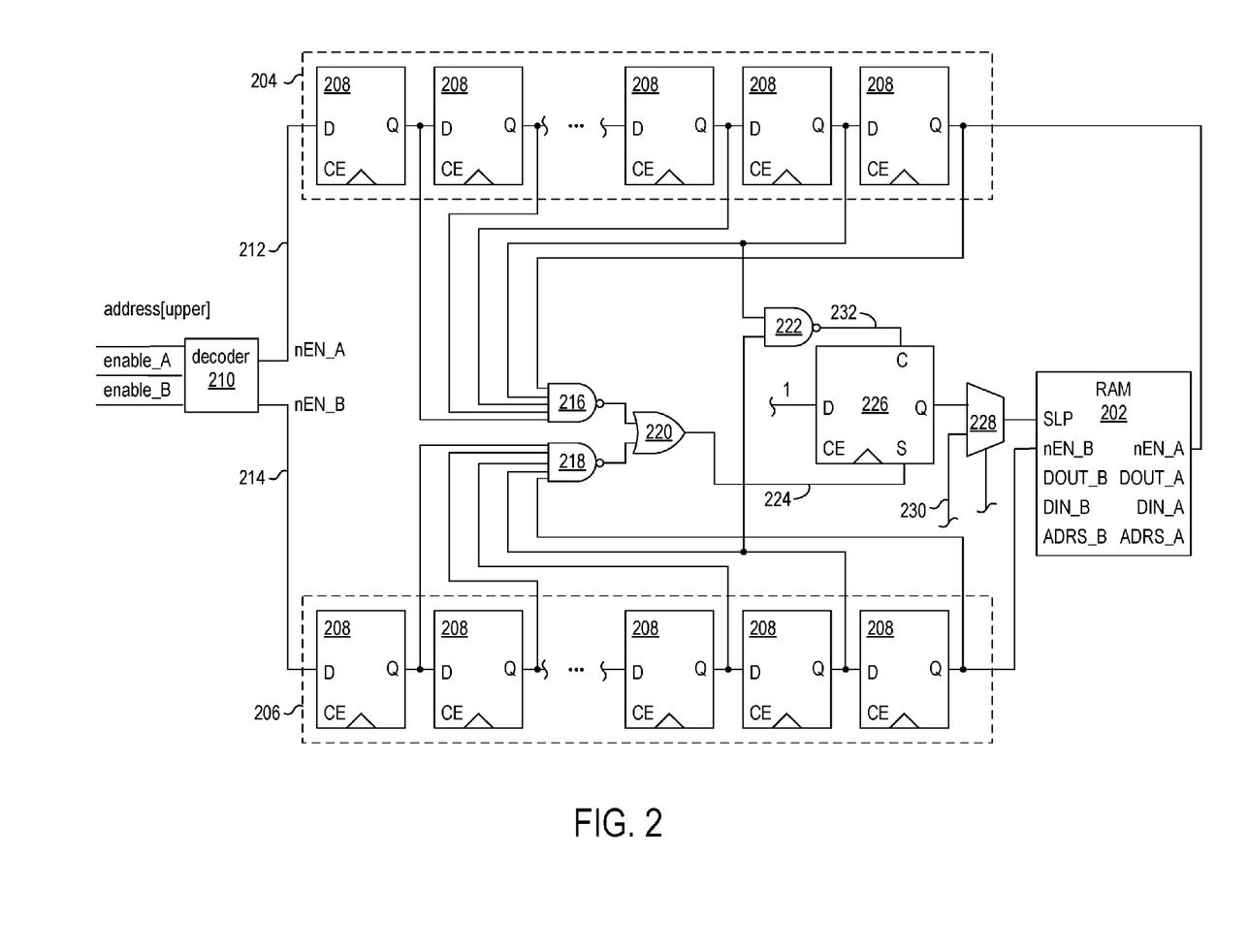
FIG. 2 shows an example of one implementation of control circuitry and FIFO buffers for switching a dual port memory cell array between sleep and standby modes.
Figure 3:
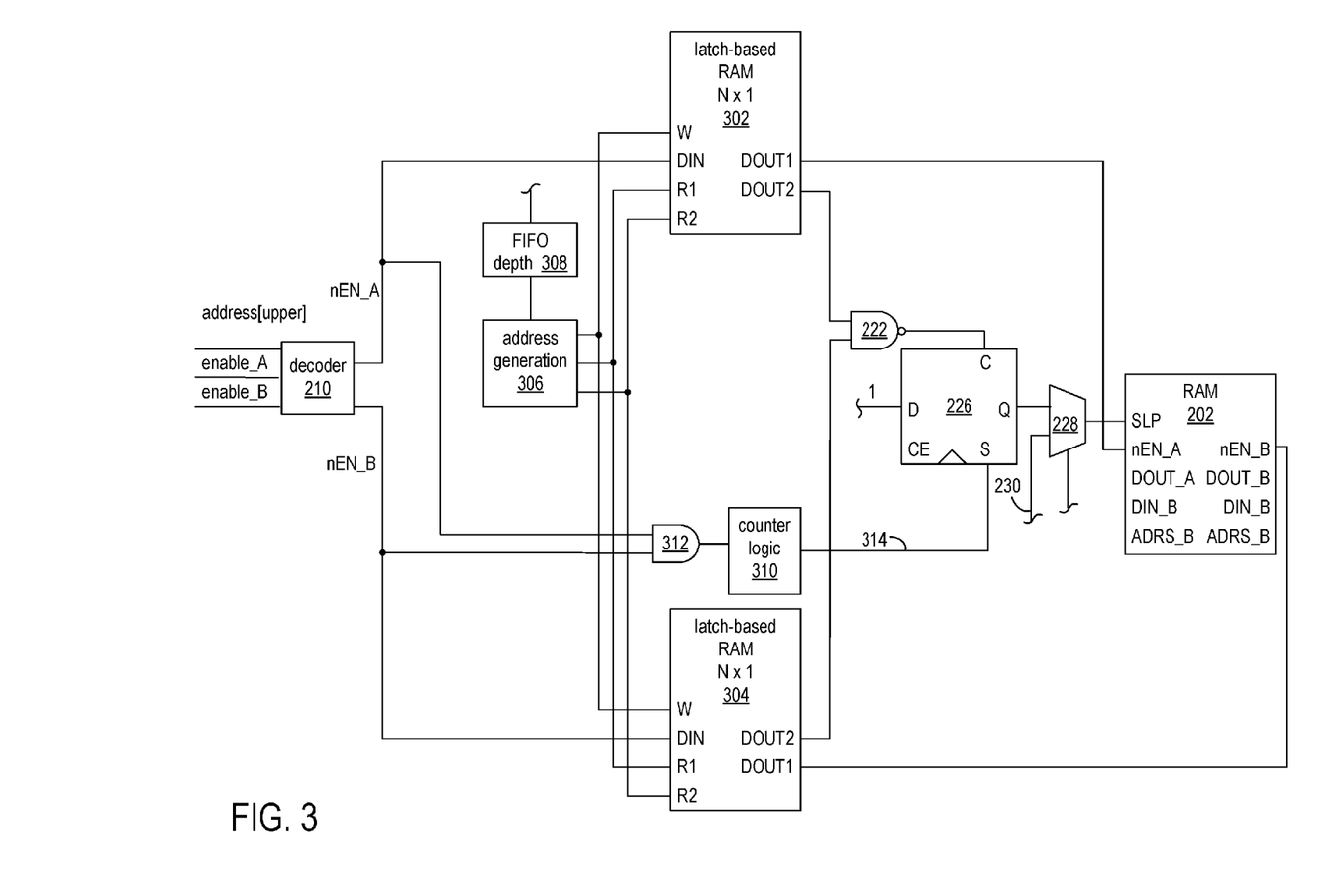
FIG. 3 shows an example of another implementation of control circuitry and FIFO buffers for switching a dual-port memory cell array between sleep and standby modes.

As will be seen in FIGS. 2 and 3, states of enable signals are stored in FIFO buffers by the control circuits associated with each of the memory cell arrays, and the state of each enable signal depends on whether or not the upper address portion matches the identifier of the memory cell array. For example, each of the control circuits 118 stores states of an enable signal in a respective FIFO buffer such as FIFO buffer 120. Data input and output lines to and from the memory matrix 102 and data lines to the memory cell arrays are not shown in order to avoid obscuring the drawing.

The set of address bits input to the memory matrix on line 122 includes the upper address portion 112 and the address lower portion 124 output from FIFO buffer 116. The upper address portion that corresponds to the address lower portion output from the FIFO buffer is transmitted to the control circuits Nh access cycles before the corresponding address lower portion. The delay introduced by FIFO buffer 116 is Nh access cycles. The upper address portion on line 126, which is input to the control circuit 118, is the same as upper address portion on line 112, and the address lower portion on line 128, which is input to the address pin of memory cell array 104, is the same as the address lower portion on line 124.

The control circuit 118 decodes the input upper address portion received on line 126 by comparing the upper address portion to an identifier assigned to the memory cell array 104. Each of the memory cell arrays has a unique identifier that is used for addressing the memory cell array. If the upper address portion matches the identifier of the memory cell array, the control circuit 118 stores a first state ("enabled state") of the enable signal in FIFO buffer 120, and if the upper address portion does not match the identifier of the memory cell array, the control circuit stores a second state ("non-enabled state") of the enable signal in FIFO buffer. The control circuit 118 stores state of the enable signal in the FIFO buffer 120 concurrently with storage of the corresponding address lower portion in the first stage of the FIFO buffer 116.

FIFO buffers 116 and 120 have the same depth and delay each address lower portion and enable signal state by Nh access cycles, which may also be referred to as the "sleep period." The delayed address lower portion and corresponding delayed state of the enable signal are thereby input to the memory cell array 104 at the same time, the address lower portion to address (ADRS) pins 130 and enable signal state to enable (EN) pin 132. Each memory cell array 104 further includes data-in pins 133 (DIN) that are coupled to receive data signals output from the FIFO buffer 117.

The control circuit 118 switches the memory cell array 104 between sleep and standby modes based on the states of the enable signal in the FIFO buffer 120. In response to all states of the enable signal in FIFO buffer 120 being in a non-enabled state, the control circuit switches the memory cell array into sleep mode by asserting the sleep signal at the sleep pin (SLP) 134 of the memory cell array.

The control circuit 118 switches the memory cell array 104 from sleep mode into standby mode when an access request to the memory cell array is near to exiting the FIFO buffers 116 and 120. The control circuit monitors the state of the enable signal in the FIFO buffer at a selected position that precedes the last position. In response to the state of the enable signal at the selected position being in an enabled state, the control circuit deasserts the sleep signal to the sleep pin 134. The selected position in the FIFO buffer allows the memory cell array to transition from the sleep mode to the standby mode in time for arrival of the state of the enable signal from the last stage of the FIFO buffer 120.

In an implementation having dual port memory cell arrays (not shown), each port includes a respective set of pins for enable, address, data-in (DIN), and data out (DOUT) signals. In addition to address line 110, another address would be input on a second address line (not shown), and the address lower portion of the second address would be stored in another FIFO buffer (not shown). Also, in addition to FIFO buffer 120 each control circuit would have another FIFO buffer (see FIGS. 2 and 3) for storing the states of enable signals for the second port of the dual port memory cell array. Separate global port enable signals (not shown) for the two ports are input to the memory matrix and distributed to the control circuits as shown in FIGS. 2 and 3. Each control circuit considers the states of the enable signals in both FIFO buffers in determining when to switch the memory cell array between sleep and standby modes.

FIG. 2 shows an example of one implementation of control circuitry and FIFO buffers for switching a dual port memory cell array 202 between sleep and standby modes. The dual port memory cell array has A and B ports, with respective sets of enable, (nEN_A, nEN_B), data out (DOUT_A, DOUT_B), data in (DIN_A, DIN_B), and address (ADRS_A, ADRS_B) pins.

FIFO buffer 204 delays states of the enable signal to the nEN_A pin of the memory cell array, and FIFO buffer 206 delays states of the enable signal to the nEN_B pin of the memory cell array. Each FIFO buffer includes a set of serially connected flip-flops 208. The FIFO buffers have an equal number of flip-flops so that the states of enable signals input at the same time to two ports of the memory matrix are provided as input to nEN_A and nEN_B pins of the memory cell array 202.

The upper address portion and global enable signals enable_A and enable_B are input to a decoder circuit 210. If the upper address portion matches the identifier of the associated memory cell array 202, and the enable_A signal is asserted, the nEN_A signal on line 212 is asserted. Similarly, if the upper address portion matches the identifier of the associated memory cell array 202, and the enable_B signal is asserted, the nEN_B signal on line 214 is asserted. The nEN_A and nEN_B signals are stored in the first stage of the FIFO buffers 204 and 206, respectively, concurrent with storage of the corresponding address lower portions in the lower portion FIFO buffers, one of which is exemplified as FIFO buffer 116 in FIG. 1. Note that the nEN_A and nEN_B enable signals are active-low, hence the notation "nEN_A" and "nEN_B."

NAND gates 216 and 218 and OR gate 220 determine when to put the memory cell array 202 into sleep mode, and NAND gate 222 determines when to wake the memory cell array and put the memory cell array into standby mode. If all the states of the enable signals in the FIFO buffers are non-enabled, the memory cell array may be put into sleep mode. That is, if none of the states of the enable signals in the FIFO buffers 204 and 206 is asserted (all are high since the enable signals are active-low), as indicated by the output signals from the flip-flops in the FIFO buffers 204 and 206, the signal on line 224 to the set pin of the flip-flop 226 is asserted, in response to which the flip-flop stores a logic 1 value. The set pin S of the flip-flop 226 is active low and the clear pin C is active high. If any one of the states of the enable signals in FIFO buffers is enabled, the memory cell array will not be put into sleep mode. The output signal from flip-flop 226 is input to multiplexer 228, which selects between output from the flip-flop or an alternative input signal on line 230. The signal on line 230 may be provided from application-specific logic that overrides the automated switching between sleep and standby modes.

NAND gate 222 controls waking the memory cell array 202. In the example implementation, transitioning the memory cell array from sleep mode to standby mode requires one access cycle. As the states of the enable signals move through the FIFO buffers 204 and 206 at a rate of one flip-flop per access cycle, the NAND gate inputs the states of the enable signals from the next-to-last flip-flop in the FIFO buffers. In response to either of the states of the enable signals from the next-to-last flip-flops being asserted, NAND gate 222 asserts the signal on line 232 to the clear pin of the flip-flop 226, which resets the value of the flip-flop to logic value 0. Once in sleep mode, the memory cell array will not be put into standby mode until the next-to-last flip-flop in either of the FIFO buffers indicates an enabled state for either of the enable signals.

FIG. 3 shows an example of another implementation of control circuitry and FIFO buffers for switching a dual-port memory cell array between sleep and standby modes. The FIFO buffers of FIG. 3 are implemented using latch-based RAM instead of the serially connected flip-flops as in FIG. 2. The latch-based RAM implementation occupies less area and is more power efficient than serially connected flip-flop implementation.

The states of enable signal nEN_A are stored in latch-based RAM 302, and the states of enable signal nEN_B are stored in latch-based RAM 304. Address generation circuit 306 controls writing enable signal states to, and reading enable signal states from the latch-based RAMs. Each of the latch-based RAMs is one bit wide and N bits deep and has two read ports and one write port. One of the read ports provides the states of the enable signals to the nEN_A and nEN_B pins of the memory cell array 202, and the other read port provides states of the enable signals to the NAND gate 222 for determining when to wake the memory cell array.

The address generation circuit includes in one implementation a register (not shown) in which the write address is stored. For ease of reference the register may be referred to as the write pointer register. The address in the write pointer register is the write address for the current access cycle, and the address generation circuit decrements the value by one for the next cycle. When the lowest address is reached (e.g., 0), the address generation circuit sets the value in the write pointer register to address the last entries (Nh−1) in the FIFO buffers. In some implementations, Nh−1 may equal N for an N-bit deep RAM, and in other implementations, Nh−1 may be less than N as specified in the configurable FIFO depth register 308.

The two read addresses may be derived from the value (wr_ptr_reg) in the write address register. The first read port is referenced as R1, and the address (rd1_ptr) input to the R1 ports of the latch-based RAMs 302 and 304 is used to read the states of the enable signals for input to the nEN_A and nEN_B pins of the memory cell array 202. If wr_ptr_reg is equal to 0, then rd1_ptr is set to Nh−1 and input to the first read ports. Otherwise, rd1_ptr is set to wr_ptr_reg−1 and input to the first read ports.

The second read port is referenced as R2, and the address (rd2_ptr) input to the R2 ports of the latch-based RAMs 302 and 304 is used to read the states of the enable signals for input to the NAND gate 222. If rd1_ptr is equal to 0, then rd2_ptr is set to Nh−1 and input to the second read ports. Otherwise, rd2_ptr is set to rd2_ptr−1 and input to the second read ports.

The counter logic circuit 310 counts the number of consecutive non-enabled states of both enable signals nEN_A and nEN_B. If the number of consecutive non-enabled states reaches Nh, the signal on line 314 input to the flip-flop 226 is asserted to put memory cell array 202 into sleep mode. The counter resets to 0 in response to either of the enable signals nEN_A and nEN_B being in an enabled state.

The counter logic circuit 310 inputs the signal from AND gate 312, which inputs the nEN_A and nEN_B signals from the decoder circuit 210. If the output from the AND gate 312 is logic 1, the counter circuit increments a count value. In response to the count value reaching Nh, the counter logic circuit asserts the signal on line 314. The count value is clamped at Nh until the output signal from the AND gate 312 is logic 0, and in response to the output signal from the AND gate 312 being logic 0, the counter logic circuit resets the counter value and deasserts the signal on line 314. A Gray code counter may be used in the counter logic circuit for power savings.

In some implementations the depth of the FIFO buffers is configurable by a depth-control circuit. For example, FIFO depth register 308 may be configured with a value that specifies Nh, and Nh−1 is the maximum address value of wr_ptr_reg provided by address generation circuit 306. The latch-based RAMs 302 and 304 are a fixed size of N bits (N≥Nh), and the implemented FIFO buffers may be any size up to N bits. In regards to the FIFO buffer 116 of FIG. 1 and storage of the address lower portions, a selector circuit (not shown) may also be coupled to the FIFO depth register 308 and to the stages of the address lower portion FIFO buffer 116 to select output from one of the stages of the address lower portion FIFO buffer according to the configured FIFO depth.

Figure 4:
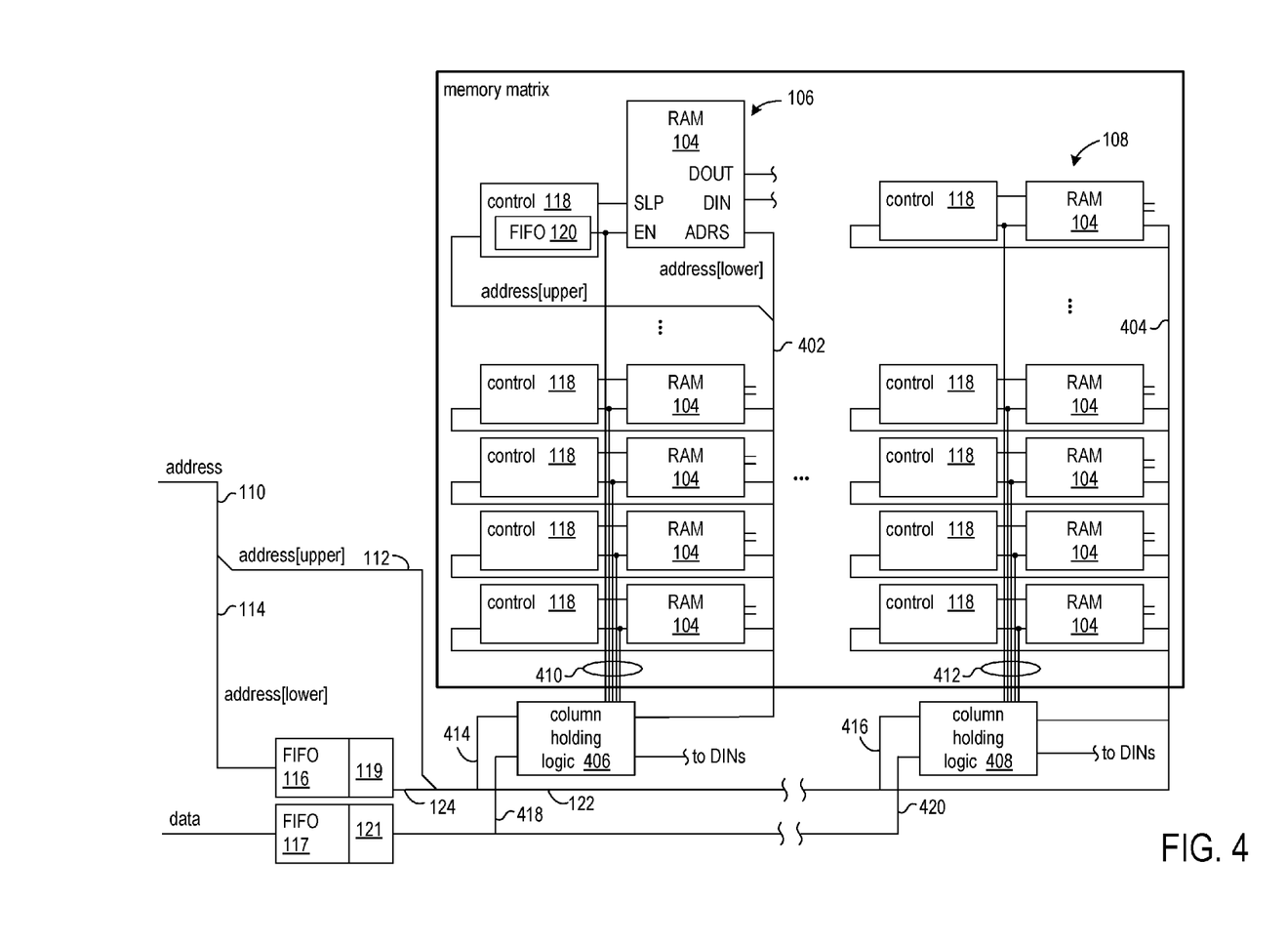
FIG. 4 shows an example of a memory matrix in which individual memory cell arrays may be switched between sleep and standby modes, and the address lower portion, data, and control signals, that are input to a column may be held in a steady state based on whether or not a memory cell array in the column is addressed.

FIG. 4 shows an example of a memory matrix in which individual memory cell arrays may be switched between sleep and standby modes and the address lower portion, data, and control signals, input to a column may be held in a steady state based on whether or not a memory cell array in the column is addressed. In the circuit arrangement of FIG. 4, additional power savings are realized by holding the address lower portion, data, and control lines of a column in a steady state for columns in which none of the memory cell arrays will be accessed by the address lower portion.

Circuitry 402 includes cascade circuitry that selectively carries address, data, and control signals to the memory cell arrays in column 106, and circuitry 404 includes cascade circuitry that selectively carries address, data, and control signals to the memory cell arrays in column 108. The cascade circuitry, which is exemplified by the circuit arrangements described in U.S. Pat. No. 9,083,340, selects between sources of address, data, and control signals for each memory cell array in a column. The cascade circuitry propagates address, data, and control signals to each of the memory cell arrays from the bottom to the top of the column. Power savings may be realized by holding the address, data, and control signals in a steady state if none of the memory cell arrays in the column will be accessed by the current address, data, and control signals.

Each of the columns 106 and 108 has an associated column holding logic circuit 406 and 408 respectively, that holds the address, data, and control signals for the column in a steady state if none of the enable signal states to the memory cell arrays in the column are in an enabled state. Column holding logic circuit 406 is coupled to receive enable signals from the control circuits 118 in column 106 as shown by lines 410, and column holding logic circuit 408 is coupled to receive enable signals from the control circuits 118 in column 108 as shown by lines 412.

The column holding logic circuits 406 and 408 are further coupled to receive the address on lines 414 and 416, respectively and data signals output from the FIFO buffer 117 on lines 418 and 420, respectively. The column holding logic circuits 406 and 408 also receive control signals (not shown). The upper address signals include column identifier bits and memory cell array identifier bits. The column identifier bits indicate the column in which the identified memory cell array is located and the memory cell array identifier bits indicate the memory cell array within the column. If the column identifier bits do not match a given column, the column holding logic holds the signal lines for the memory cell identifier bits in a steady state.

In response to any one of the enable signal states on lines 410 enabling one of the memory cell arrays of column 106, the column holding logic circuit 406 passes the address lower portion to the cascade circuitry 402. Similarly, in response to any one of the enable signal states on lines 412 enabling one of the memory cell arrays of column 108, the column holding logic circuit 408 passes the address lower portion to the cascade circuitry 404.

In response to none of the enable signal states on lines 410 enabling any of the memory cell arrays of column 106, the column holding logic circuit 406 holds the address lower portion, control, and data signal lines of cascade circuitry 402 in a steady state. In response to none of the enable signal states on lines 412 enabling any of the memory cell arrays of column 108, the column holding logic circuit 408 holds the address lower portion, control, and data signal lines of cascade circuitry 404 in a steady state.

In an implementation having dual port memory cell arrays, the circuit arrangement of FIG. 4 would include another instance of FIFO buffer 116 for storing the lower portion of the address for the second port as described above, and each of the control circuits 118 would include two instances of FIFO buffers 120 as shown in FIGS. 2 and 3. The column holding logic circuits 406 and 408 would be coupled to receive the states of the enable signals for both ports of the memory cell arrays in the respective columns. The address lower portion, data, and control signals would be held in a steady state if all of the states of the enable signals to the memory cell arrays in the column are non-enabled. The address lower portion, data, and control signals would be passed to the cascade circuitry if any of the states of the enable signals to the memory cell arrays in the column are enabled.

Figure 5:
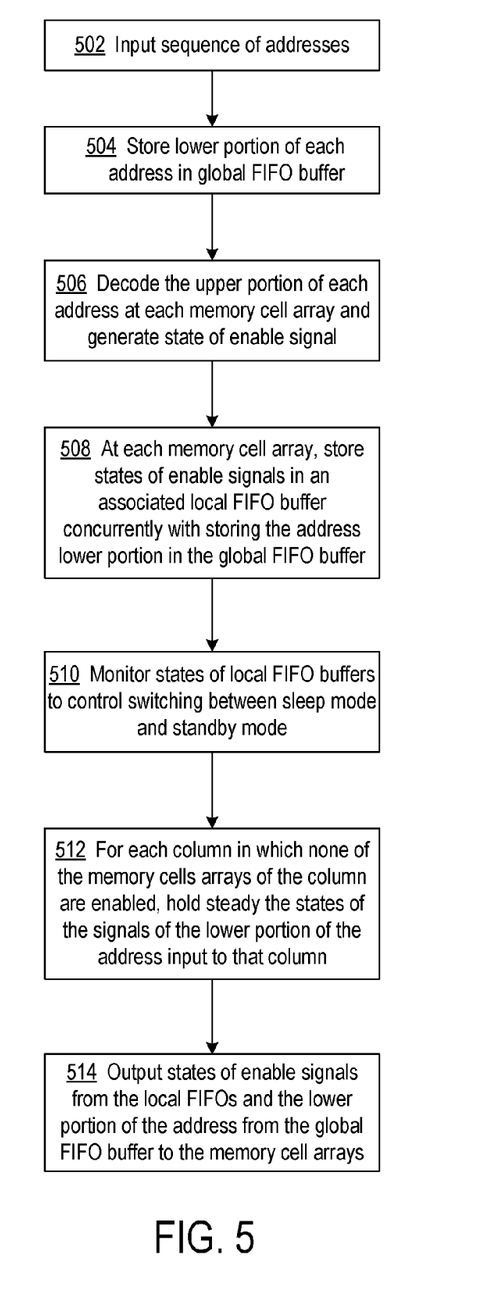
FIG. 5 shows a flowchart of a process of pipelining memory access requests and switching memory cell arrays between sleep and standby modes.

FIG. 5 shows a flowchart of a process of pipelining memory access requests and switching memory cell arrays between sleep and standby modes. At block 502, a circuit arrangement, which controls access to an arrangement of memory cell arrays, inputs a sequence of memory access requests. Each access request includes an address. The circuit arrangement stores the lower portion of each address of the sequence in a FIFO buffer at block 504. The FIFO buffer delays the input of each address lower portion to the memory cell arrays by a sleep period.

At block 506, respective control circuits associated with the memory cell arrays decode the upper portion of each address in the sequence. The control circuits generate states of enable signals based on the decoded upper portion of each address. If the decoded upper portion of an address matches the identifier of a memory cell array, the generated state of the enable signal is enabled. If the decoded upper portion of an address does not match the identifier of a memory cell array, the generated state of the enable signal is non-enabled. In an implementation having dual port memory cell arrays, the control circuit further inputs global enable signals that indicate which of the two ports is to be enabled for processing the access request.

The control circuits store the states of the generated enable signals in associated, local FIFO buffers at block 508. The states of the generated enable signals are stored in the first stage of the local FIFO buffers concurrently with storing the corresponding address lower portion in the first stage of the address-lower-portion FIFO buffer. The local FIFO buffers delay the states of the enable signals for the same period (sleep period) as the address-lower-portion FIFO buffer delays the address lower portion. The local FIFO buffers may be latch-based RAMS or serially connected flip-flops as described above.

At block 510, the control circuits monitor the local FIFO buffers to determine whether to put the associated memory cell array into sleep mode or to wake the associated memory cell array and put the memory cell array into standby mode. In response to all states of the enable signal in the respective local FIFO buffer being in a non-enabled state, the associated control circuit switches the memory cell array into sleep mode. In response to the state of the enable signal at a selected position, which precedes the last position, in the local FIFO buffer being in an enabled state, the control circuit switches the associated memory cell array into standby mode. The selected position allows the memory cell array to transition from the sleep mode to the standby mode by the time the state of the enable signal output from the last stage of the local FIFO buffer is input to the associated memory cell array.

In another implementation, an application-specific input signal may be used to override the one of the sleep mode or standby mode determined by the control circuit. The control circuit generates a first sleep signal in response to all the states of the enable signal in the local FIFO buffer being in the non-enabled state. In response to an application control signal, the control circuit selects between the first sleep signal and a second sleep signal for input to the sleep pin of the memory cell array. The second sleep signal may be driven by application-specific logic.

At block 512, column holding logic circuits determine whether or not to hold in a steady state address lower portion, data, and control signals that are input cascade circuitry of columns of memory cell arrays. In response to all the states being non-enabled for the enable signals that are output by the local FIFO buffers associated with memory cell arrays in a column, the column holding logic circuit for that column holds in a steady state the address lower portion, data, and control signals input to the cascade circuitry of that column.

In response to any one of the states being enabled for the enable signals that are output by the local FIFO buffers associated with memory cell arrays in a column, the column holding logic circuit for that column states of the address lower portion, data, and control signals to the cascade circuitry, which propagates the signal states to the control circuits and memory cell arrays of that column.

The local FIFO buffers output the states of the enable signals and the global FIFO buffer outputs the address lower portion to the memory cell arrays at block 514. In one implementation, the depth of the FIFO buffers may be configurable by a value stored in a FIFO depth register. The stage of the FIFO buffers from which the states of the enable signals and the address lower portion are selected is controlled by the value in the FIFO depth register.

Figure 6:
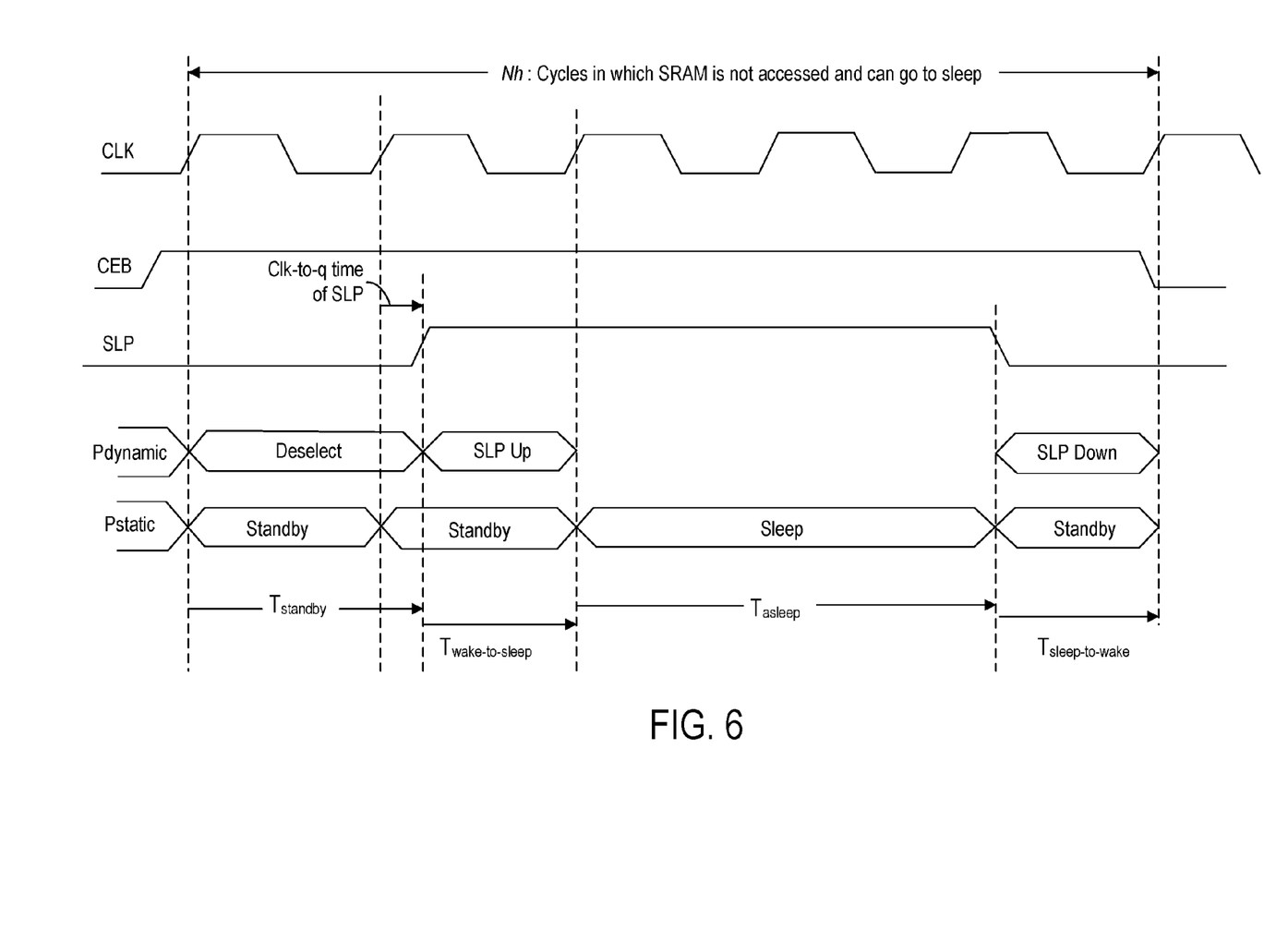
FIG. 6 shows a waveform diagram of transitions between standby mode and sleep mode.

FIG. 6 shows a waveform diagram of transitions between standby mode and sleep mode. The waveform diagram shows the inequality used to derive the minimum number of access cycles (Nh) for which a memory cell array must be in sleep mode in order to realize power savings. The following parameters are used in the power savings computation:

N is the matrix size, i.e., number of memory cell arrays in a matrix
$\alpha$ is the activity factor per port
$\beta$ is the ratio of clk-to-q of asserting SLP pin to clock period
Nh is the parameter programmed by a user in a FIFO depth register
N'h is the inherent hysteresis window size for a given corner lot
Ps is the standby total power given by $$Psb = Psb\_static + Psb\_dynamic$$

Psb_stati is the standby static leakage power
Psb_dynami is the standby dynamic power
Psl is the sleep mode static leakage power
Pslp_pin_u is the sleep pin asserted power
Pslp_pin_dow is the sleep pin de-asserted power From the waveform diagram, the following inequality shows how to achieve power-savings:

$$(Psb\_static + Psb\_dynamic) + (\beta Psb\_dynamic + Pslp\_pin\_up + Psb\_static) + (N'h-3)Pslp + (Pslp\_pin\_down + Psb\_static) \leq N'h(Psb\_static + Psb\_dynamic)$$

From the above inequality, the minimum hysteresis window size (Nh) is:

$$N'h \geq ((1+\beta)sb\_dynamic + Pslp\_pin\_up + Pslp\_pin\_down + 3(Psb\_static - Pslp))/(Psb\_static + Psb\_dynamic - Pslp)$$

Figure 7:
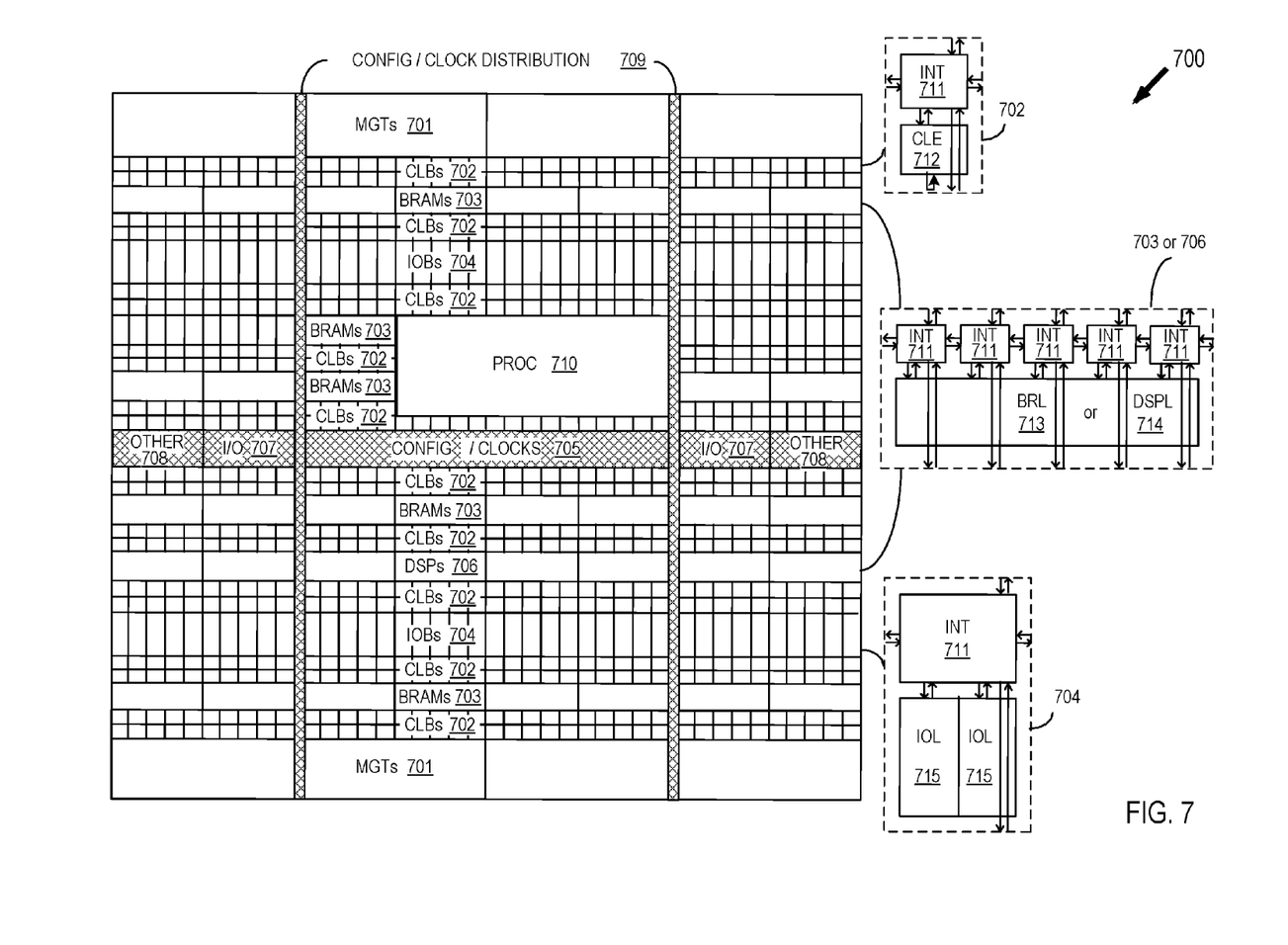
FIG. 7 shows a programmable integrated circuit (IC) on which the disclosed circuits and processes may be implemented.

FIG. 7 shows a programmable integrated circuit (IC) 700 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 7 illustrates programmable IC 700 that includes a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized input/output blocks (I/O) 707, for example, clock ports, and other programmable logic 708 such as digital clock managers, analog-to-digital converters, system monitoring logic, and so forth. Some programmable IC having FPGA logic also include dedicated processor blocks (PROC) 710 and internal and external reconfiguration ports (not shown).

In some FPGA logic, each programmable tile includes a programmable interconnect element (INT) 711 having standardized connections to and from a corresponding interconnect element in each adjacent tile. Therefore, the programmable interconnect elements taken together implement the programmable interconnect structure for the illustrated FPGA logic. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic, plus a single programmable interconnect element INT 711. A BRAM 703 can include a BRAM logic element (BRL) 713 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL) 714 in addition to an appropriate number of programmable interconnect elements. An IOB 704 can include, for example, two instances of an input/output logic element (IOL) 715 in addition to one instance of the programmable interconnect element INT 711. As will be clear to those of skill in the art, the actual I/O bond pads connected, for example, to the I/O logic element 715, are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 7 include additional logic blocks that disrupt the regular columnar structure making up a large part of the programmable IC. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The disclosed methods and circuits are thought to be applicable to a variety of systems for processing memory access requests. Other aspects and features will be apparent to those skilled in the art from consideration of the specification. The methods and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A circuit arrangement, comprising:
    a plurality of memory cell arrays addressed by a first portion of an input address, and memory cells within each memory cell array addressed by a second portion of the input address;
    a first first-in-first-out (FIFO) buffer coupled to the plurality of memory cell arrays, wherein the first FIFO buffer is configured and arranged to delay the second portion of the input address to the plurality of memory cell arrays for a sleep period;
    a plurality of control circuits coupled to the plurality of memory cell arrays, respectively, each control circuit including a respective second FIFO buffer and configured and arranged to:
        decode the first portion of the input address and generate a corresponding state of an enable signal,
        store the corresponding state of the enable signal in the respective second FIFO buffer concurrently with input of the second portion of the input address to the first FIFO buffer, wherein the second FIFO buffer is configured and arranged to delay output of the corresponding state of the enable signal to the respective memory cell array for the sleep period, and
        switch the respective memory cell array into a sleep mode in response to all states of the enable signal in the second FIFO buffer being in a non-enabled state.

2. The circuit arrangement of claim 1, wherein each control circuit is further configured and arranged to:
    switch the respective memory cell array into a standby mode in response to a state of the enable signal at a selected position in the second FIFO buffer being in an enabled state, and the selected position in the second FIFO buffer allowing the memory cell array to transition from the sleep mode to the standby mode before the state of the enable signal output from the second FIFO buffer is input to the respectively coupled memory cell array.

3. The circuit arrangement of claim 1, wherein the second FIFO buffer is a latch-based RAM.

4. The circuit arrangement of claim 1, wherein the second FIFO buffer includes a plurality of serially connected flip-flops.

5. The circuit arrangement of claim 1, further comprising:
    a register configurable with a FIFO depth value; and
    a first depth-control circuit coupled to the register and to a plurality of stages of the first FIFO buffer, the first depth-control circuit configured and arranged to control depth of the first FIFO buffer by selection of output from one of the plurality of stages of the first FIFO buffer in response to the FIFO depth value; and
    wherein each control circuit of the plurality of control circuits includes a respective second depth-control circuit coupled to the register and to a plurality of stages of the second FIFO buffer, each second depth-control circuit configured and arranged to control depth of the second FIFO buffer by selection of output from one of the plurality of stages of the second FIFO buffer in response to the depth value.

6. The circuit arrangement of claim 1, wherein:
    the plurality of memory cell arrays are arranged in a matrix having rows and columns of the memory cell arrays; and
    cascade circuitry in each column is configured and arranged to propagate the second portion of the input address output from the first FIFO buffer from a first memory cell array in the column to a last memory cell array in the column.

7. The circuit arrangement of claim 6, further comprising:
    a plurality of column-holding circuits coupled to the cascade circuitry of the columns, respectively, each column-holding circuit coupled to receive enable signal states output from the respective second FIFO buffers of the memory cell arrays in the respective column;
    wherein each column-holding circuit is configured and arranged to:
        pass a second address portion output from the first FIFO buffer to the cascade circuitry of the respective column in response to one of the enable signal states enabling one of the memory cell arrays of the respective column; and
        hold address signal lines of the respective cascade circuitry in a steady state in response to none of the enable signal states enabling any of the memory cell arrays of the respective column.

8. The circuit arrangement of claim 1, wherein:
    each control circuit includes an address decoder, and each address decoder is configured and arranged to generate the corresponding state of the enable signal in response to the first portion of the input address and a state of a global enable signal.

9. The circuit arrangement of claim 1, wherein:
    each memory cell array includes a sleep pin;
    each control circuit includes:
        a detection circuit coupled to the second FIFO buffer and configured and arranged to generate a first sleep signal in response to all states of the enable signal in the second FIFO buffer being in the non-enabled state;
        a selection circuit coupled to the sleep pin and coupled to receive the first sleep signal from the detection circuit and to receive a second sleep signal, wherein the selection circuit is configured and arranged to select between the first and second sleep signals and provide a selected one of the first and second sleep signals to the sleep pin.

10. The circuit arrangement of claim 1, wherein each memory cell array of the plurality of memory cell arrays is a dual port memory having a first port and a second port, and the circuit arrangement further comprising:
    a third FIFO buffer coupled to the second ports of the plurality of memory cell arrays and configured and arranged to delay the second portion of the input address to the second port the plurality of memory cell arrays for the sleep period;
    wherein the first FIFO buffer is coupled to the first ports of the plurality of memory cell arrays;
    wherein each control circuit further includes a fourth FIFO buffer and is further configured and arranged to:

decode the first portion of the input address to the first port and generate a corresponding state of a first-port enable signal, decode the first portion of the input address to the second port and generate a corresponding state of a second-port enable signal, store in the second FIFO buffer concurrent with input to the first FIFO buffer of the second portion of the input address to the first port, the corresponding state of the first-port enable signal, store in the fourth FIFO buffer concurrent with input to the second FIFO buffer of the second portion of the input address to the second port, the corresponding state of the second-port enable signal, and switch the respective memory cell array into a sleep mode in response to all states of the first-port enable signal in the second FIFO buffer and all states of the second-port enable signal in the fourth FIFO buffer being in a non-enabled state.

11. The circuit arrangement of claim 10, wherein each control circuit is further configured and arranged to:

switch the respectively coupled memory cell array into a standby mode in response to a state of the first-port enable signal at a position in the second FIFO buffer being in an enabled state or a state of the second-port enable signal at a position in the fourth FIFO buffer being in an enabled state, and the position in the second FIFO buffer and the position in the fourth FIFO buffer allowing the memory cell array to transition from the sleep mode to the standby mode before the state of the first-port enable signal exits the second FIFO buffer and the second-port enable signals exits the fourth FIFO buffer.

12. A method of controlling power modes on a plurality of memory cell arrays, comprising:

inputting a sequence of addresses to a plurality of memory cell arrays, each address including a first portion that addresses the memory cell arrays and a second portion that addresses memory cells within each memory cell array;

storing second portions of the sequence of addresses in a first first-in-first-out (FIFO) buffer;

delaying input of the second portion of each input address to the plurality of memory cell arrays for a sleep period by the first FIFO buffer;

decoding the first portion of each address at a plurality of control circuits coupled to the plurality of memory cell arrays, respectively, and generating corresponding states of enable signals based on the decoded first portion of each address;

storing the corresponding states of the enable signals in a plurality of second FIFO buffers, respectively, concurrently with input of the second portion of each input address to the first FIFO buffer, wherein each second FIFO buffer is configured and arranged to delay output of the corresponding state of the enable signal to a respective one of the memory cell arrays for the sleep period; and switching a respective one of the memory cell arrays into a sleep mode in response to all states of the enable signal in the respective second FIFO buffer being in a non-enabled state.

13. The method of claim 12, further comprising:

switching a respective one of the memory cell arrays into a standby mode in response to a state of the enable signal at a position in the respective one of the second FIFO buffers being in an enabled state, wherein the position in the second FIFO buffer allows the memory cell array to transition from the sleep mode to the standby mode before the state of the enable signal output from the second FIFO buffer is input to the respectively one of the memory cell arrays.

14. The method of claim 12, wherein the storing the corresponding states of the enable signals in a plurality of second FIFO buffers includes storing the corresponding states of the enable signals in a plurality of latch-based RAMs.

15. The method of claim 12, wherein the storing the corresponding states of the enable signals in a plurality of second FIFO buffers includes storing the corresponding states of the enable signals in respective pluralities of serially connected flip-flops.

16. The method of claim 12, wherein the first FIFO buffer includes a plurality of stages, and each second FIFO buffer includes the plurality of stages, and the method further comprising:

selecting output from one of the plurality of stages of the first FIFO buffer as output from the first FIFO buffer in response to a depth value stored in a register;

selecting output from one of the plurality of stages of each second FIFO buffer as output from the second FIFO buffer in response to the FIFO depth value.

17. The method of claim 12, wherein the plurality of memory cell arrays are arranged in a matrix having rows and columns of the memory cell arrays, and the method further comprising:

propagating the each second portion of an address output from the first FIFO buffer circuit from a first memory cell array in the column to a last memory cell array in the column.

18. The method of claim 17, further comprising:

receiving at each column-holding circuit of a plurality of column-holding circuits coupled to the memory cell arrays in the columns, respectively, enable signal states output from the second FIFO buffers coupled to the memory cell arrays in the respective column;

passing, by each column-holding circuit, a second address portion output from the first FIFO buffer to the memory cell arrays in the respective column in response to one of the enable signal states enabling one of the memory cell arrays of the respective column; and holding, by each column-holding circuit, address signal lines to the memory cell arrays in the respective column in a steady state in response to none of the enable signal states enabling any of the memory cell arrays of the respective column.

19. The method of claim 12, wherein:

the decoding the first portion of each address includes determining a match state based on the first portion of each address and an identifier of each memory cell array; and the generating the corresponding states of enable signals includes generating the corresponding state of each enable signal in response to the match state and a state of a global enable signal.

20. The method of claim 12, wherein each memory cell array includes an associated sleep pin, and the method further comprising:

generating in association with each memory cell array, a respective first sleep signal in response to all corresponding states of the enable signal in the respective second FIFO buffer being in the non-enabled state;

selecting between the respective first sleep signal and a second sleep signal for input to the associated sleep pin of the memory cell array.

* * * * *